United States Patent
Serwy et al.

(10) Patent No.: US 10,212,514 B2
(45) Date of Patent: Feb. 19, 2019

(54) METHOD FOR LIMITING AMPLIFIER INPUT CURRENT TO AVOID LOW VOLTAGE CONDITIONS

(71) Applicant: Cirrus Logic International Semiconductor Ltd., Edinburgh (GB)

(72) Inventors: Roger Serwy, Austin, TX (US); Jason W. Lawrence, Austin, TX (US); Firas Azrai, Austin, TX (US); Jeffrey Allen May, Dripping Springs, TX (US); Jie Su, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/918,705

(22) Filed: Mar. 12, 2018

(65) Prior Publication Data

US 2018/0206034 A1    Jul. 19, 2018

Related U.S. Application Data

(63) Continuation-in-part of application No. 15/463,377, filed on Mar. 20, 2017.

(Continued)

(51) Int. Cl.
*H04R 3/00* (2006.01)
*H04R 29/00* (2006.01)
(Continued)

(52) U.S. Cl.
CPC .............. *H04R 3/007* (2013.01); *H03F 1/52* (2013.01); *H03F 3/183* (2013.01); *H03F 3/21* (2013.01);
(Continued)

(58) Field of Classification Search
CPC ........ H04R 3/007; H04R 3/04; H04R 29/001; H04R 1/1041; H04R 3/00; H04R 2430/01;
(Continued)

(56) References Cited

U.S. PATENT DOCUMENTS

| 4,873,493 A | 10/1989 | Fujiwara |
| 6,417,659 B1 | 7/2002 | Schroeder |

(Continued)

FOREIGN PATENT DOCUMENTS

| EP | 2712209 A1 | 3/2014 |
| WO | 2016040177 A1 | 3/2016 |
| WO | 2017087246 A1 | 5/2017 |

OTHER PUBLICATIONS

Combined Search and Examination Report under Sections 17 and 18(3), UKIPO, Application No. GB1706283.7, dated Oct. 20, 2017.

(Continued)

*Primary Examiner* — Norman Yu
(74) *Attorney, Agent, or Firm* — Jackson Walker L.L.P.

(57) ABSTRACT

A predictive brownout prevention system may be configured to prevent brownout of an audio output signal. Particularly, the brownout prevention system may be configured to receive information indicative of adaptive estimates of power supply conditions, wherein the information indicative of adaptive estimates of the power supply conditions comprises information regarding a voltage component and a resistive component received from an adaptive battery model of a battery for providing electrical energy to a power supply for generating the power supply voltage and adapt the adaptive battery model based on a monitored battery voltage output by the battery and loading events of the signal path and excluding loading events of components other than the signal path which are powered from the battery.

32 Claims, 10 Drawing Sheets

Related U.S. Application Data

(60) Provisional application No. 62/382,844, filed on Sep. 2, 2016, provisional application No. 62/348,364, filed on Jun. 10, 2016.

(51) Int. Cl.
*H03F 3/21* (2006.01)
*H03F 3/183* (2006.01)
*H04R 1/10* (2006.01)
*H03F 1/52* (2006.01)
*H03G 3/20* (2006.01)

(52) U.S. Cl.
CPC ......... *H04R 1/1041* (2013.01); *H04R 29/001* (2013.01); *H03F 2200/03* (2013.01); *H03F 2200/211* (2013.01); *H04R 3/00* (2013.01); *H04R 2430/01* (2013.01); *H04R 2460/03* (2013.01)

(58) Field of Classification Search
CPC ....... H04R 2460/03; H03F 3/183; H03F 3/21; H03F 2200/03; H03F 2200/102; H03F 1/52; H03F 2200/211; H03G 3/007; H03G 3/301
USPC .............................................. 381/55, 96, 107
See application file for complete search history.

(56) References Cited

U.S. PATENT DOCUMENTS

| | | |
|---|---|---|
| 2001/0048292 A1 | 12/2001 | Wahl |
| 2007/0140513 A1 | 6/2007 | Furge |
| 2009/0271186 A1 | 10/2009 | LeBlanc et al. |
| 2010/0321115 A1 | 12/2010 | Mohajeri et al. |
| 2012/0177226 A1* | 7/2012 | Silverstein ............ G06F 1/3212 381/107 |
| 2013/0311794 A1 | 11/2013 | Stewart |
| 2015/0263688 A1 | 9/2015 | Nicolino, Jr. et al. |
| 2016/0126899 A1* | 5/2016 | Doy ...................... H03F 1/0211 330/295 |

OTHER PUBLICATIONS

International Search Report and Written Opinion of the International Searching Authority, International Application No. PCT/US2017/036157, dated Jan. 17, 2018.
"Battery Performance Characteristics." Electropaedia, 2004. Web. <http://www.mpoweruk.com/performance.htm>.
"Soft Clippers." Native Instruments, Mar. 4, 2007. Web. <https://www.native-instruments.com/forum/threads/soft-clippers.46859/>.

\* cited by examiner

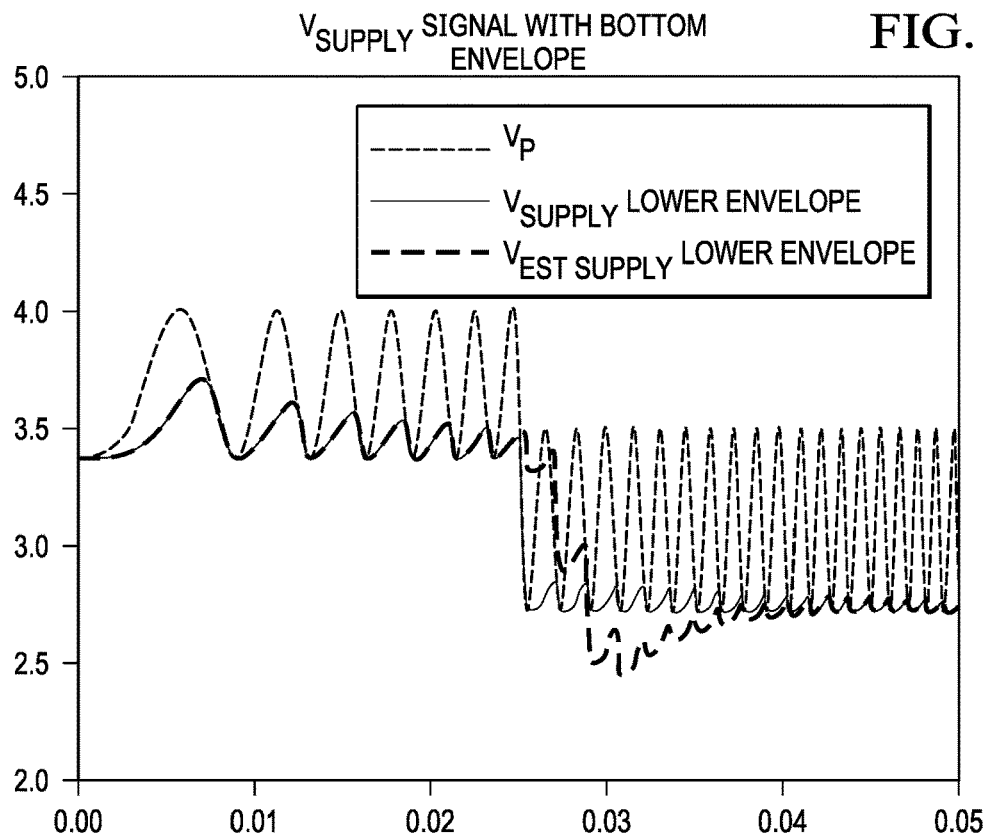
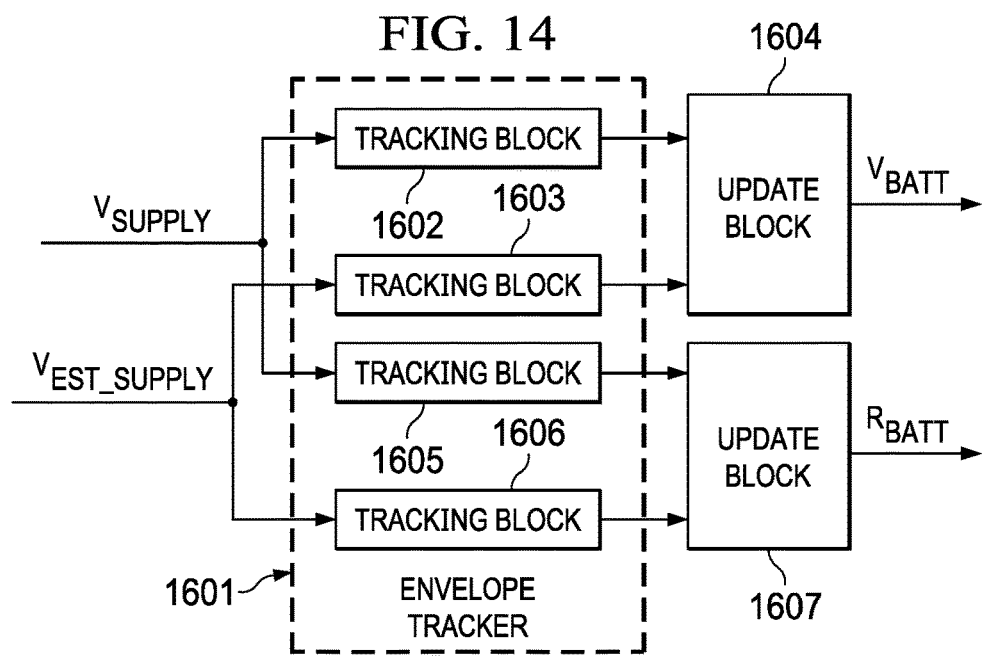

METHOD FOR LIMITING AMPLIFIER INPUT CURRENT TO AVOID LOW VOLTAGE CONDITIONS

CROSS-REFERENCES AND RELATED APPLICATION

The present disclosure cross references U.S. Provisional Patent Application Ser. No. 61/834,696, filed Jun. 13, 2013, and U.S. Non-Provisional patent application Ser. No. 14/169,349, filed Jan. 31, 2014, which are both incorporated by reference herein in their entirety.

The present disclosure is a continuation-in-part of U.S. Non-Provisional patent application Ser. No. 15/463,377, filed Mar. 20, 2017, which claims benefit of U.S. Provisional Patent Application Ser. No. 62/348,364, filed Jun. 10, 2016 and U.S. Provisional Patent Application Ser. No. 62/382,844, filed Sep. 2, 2016, all of which are incorporated by reference herein in their entirety.

FIELD OF DISCLOSURE

The present disclosure relates in general to circuits for audio devices, including without limitation personal audio devices such as wireless telephones and media players, and more specifically, to systems and methods for predictively preventing a brownout condition in a personal audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

In general, personal audio devices continue to be reduced in size, yet many users desire louder sound from these personal audio devices. This places physical size constraints on a battery for powering components of the personal audio devices at the same time audio subsystems of such personal audio devices are demanding more output power. With the desire for higher audio volumes and quality, often a boosted supply voltage higher than the battery voltage is generated in order to supply an audio amplifier and deliver more power to the speaker load. As more power is delivered to the speaker load, more strain is placed on the battery of a personal audio device.

A battery includes an output impedance, and thus heavy loading conditions on a battery can cause a battery's output voltage to drop. Such drop in output voltage may be more prominent when the battery has a low level of charge. The sudden voltage drop produced by this loading event has the potential to reduce the battery's output voltage to a point where certain subsystems on the device are no longer able to function properly. When the battery is in a weakened or lower charge state and the personal audio device offers no protection against such weakened or lower charge state, often the end result is the personal audio device resetting itself due to a low voltage condition. This self-reset condition may be displeasing to a user of the personal audio device and thus problematic for the provider of the personal audio device (e.g., manufacturer, vendor, reseller, or other provider in a chain of commerce). Such a condition or conditions similar thereto in which an unintentional voltage drop occurs are commonly referred to as "brownout" conditions.

Traditional approaches to mitigation of brownout conditions in personal audio devices have been reactive in nature, in that a reactive brownout reduction system typically identifies the occurrence of a battery voltage falling below a predetermined voltage threshold (e.g., configured by a user or a provider of the personal audio device) and reacts responsive to the battery voltage falling below such threshold. An example of such reaction is a reduction of audio volume in order to reduce an audio amplifier's load on the battery.

This reactive methodology is based on a concept that an undesirable event has already occurred to the battery supply, and thus the personal audio device quickly takes action to reduce loading in order to prevent brownout of the personal audio device. Subsystems other than the audio subsystem and powered by the battery supply may also react independently in order to reduce loading on the battery supply and allow it to return to a safe level in order to maintain functionality of more critical subsystems of the personal audio device. Such reactive approaches do little or nothing to prevent the audio subsystem, and in particular an audio amplifier, from being a cause of the battery supply falling to an undesirable level that may trigger a brownout condition. A reactive brownout reduction system typically has no knowledge of the audio content and by extension, no knowledge of actual power supply loading caused by an audio signal path. Instead, such existing systems typically assume that the loading of an output amplifier of the audio signal path is the source of the supply drop and blindly reduce loading of the output amplifier, even if it is not the main source of the reduction in power supply.

A reactive brownout reduction system requires a certain amount of time to react before the audio signal to the audio amplifier is attenuated. Once the voltage supply of the battery drops, it also takes an additional amount of time to attenuate the audio signal and allow the battery supply to return to a "safe" operating voltage. The cumulative initial reaction time, system response time, and the battery supply recovery time may cause the system to spend a significant amount of time below the preconfigured threshold voltage of the battery supply.

If the audio system, in particular the audio amplifier, is the primary cause of the battery supply drop, and the battery is in a weakened state, this reactive methodology also has the potential of getting into a state of operation where the audio volume is repeatedly attenuated and then allowed to gain back up. From a user's perspective, this can produce a "pumping" effect of the audio content, where audio volume repeatedly gets louder and softer, as the reactive brownout reduction system may put the reactive brownout response into a continual loop.

SUMMARY

In accordance with the teachings of the present disclosure, certain disadvantages and problems associated with loudspeaker electrical identification have been reduced or eliminated.

In accordance with embodiments of the present disclosure, an apparatus for providing an audio output signal to an audio transducer may include a signal path comprising an audio input configured to receive an audio input signal, an audio output configured to provide an audio output signal, a power supply input configured to receive a power supply voltage, and an attenuation block. The attenuation block may be configured to receive information indicative of adaptive estimates of power supply conditions, wherein the information indicative of adaptive estimates of the power supply conditions comprises information regarding a voltage component and a resistive component received from an adaptive battery model of a battery for providing electrical energy to a power supply for generating the power supply voltage, adapt the adaptive battery model based on a monitored battery voltage output by the battery and loading events of the signal path and excluding loading events of components other than the signal path which are powered from the battery, and in response to determining that a portion of the audio input signal has reached a maximum power threshold, generate a selectable attenuation signal to reduce an amplitude of the audio output signal such that the signal path attenuates the audio input signal or a derivative thereof in order to prevent brownout prior to propagation to the audio output of the portion of the audio input signal.

In accordance with these and other embodiments of the present disclosure, a method for providing an audio output signal to an audio transducer may include receiving information indicative of an amplitude of an audio input signal, receiving information indicative of a condition of a power supply of a signal path having an audio input for receiving the audio input signal and an audio output for providing the audio output signal, receiving information indicative of adaptive estimates of power supply conditions, wherein the information indicative of adaptive estimates of the power supply conditions comprises information regarding a voltage component and a resistive component received from an adaptive battery model of a battery for providing electrical energy to a power supply for generating the power supply voltage, adapting the adaptive battery model based on a monitored battery voltage output by the battery and loading events of the signal path and excluding loading events of components other than the signal path which are powered from the battery, and in response to determining that a portion of the audio input signal has reached a maximum power threshold, generate a selectable attenuation signal to reduce an amplitude of the audio output signal such that the signal path attenuates the audio input signal or a derivative thereof in order to prevent brownout prior to propagation to the audio output of the portion of the audio input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein:

FIG. 13 is a graphical representation of an upper-side envelope of a supply voltage, in accordance with embodiments of the present disclosure;

FIG. 14 is a block diagram of an adaptive battery model, in accordance with embodiments of the present disclosure.

DETAILED DESCRIPTION

Figure 1:
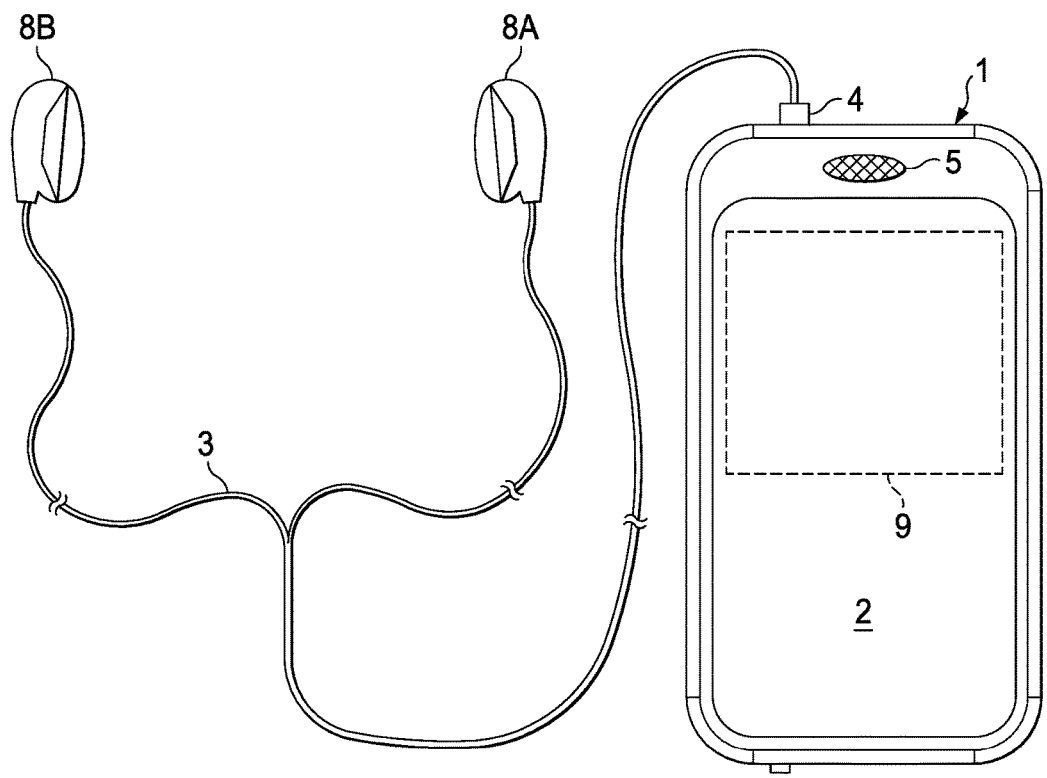
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
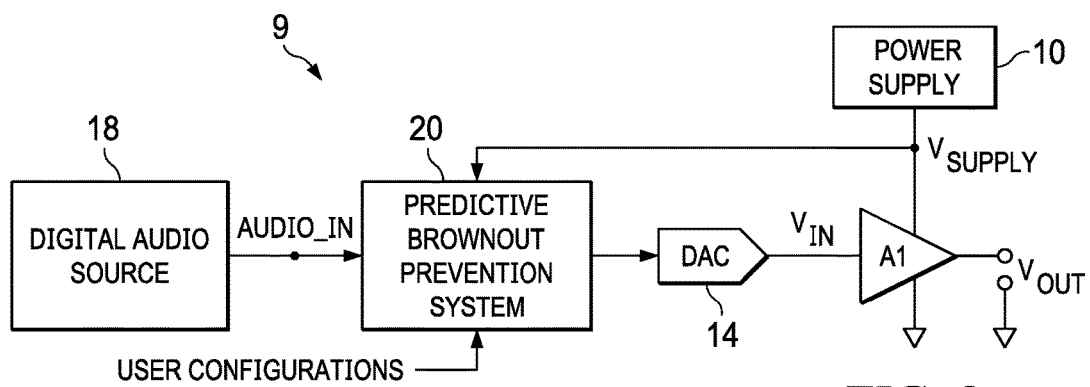
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a digital audio source 18 (e.g., a processor, digital signal processor, microcontroller, test equipment, or other suitable digital audio source) may supply a digital audio input signal AUDIO_IN to a predictive brownout prevention system 20, which may process digital audio input signal AUDIO_IN and provide such processed signal to a digital-to-analog converter (DAC) 14, which may in turn supply an analog audio input signal $V_{IN}$ to a power amplifier stage A1 which may amplify or attenuate the audio input signal $V_{IN}$ and provide an audio output signal $V_{OUT}$, which may operate a speaker, headphone transducer, and/or a line level signal output. Although amplifier A1 is depicted as a single-ended output generating a single-ended audio output signal $V_{OUT}$, in some embodiments, amplifier A1 may comprise a differential output, and may thus provide a differential audio output signal $V_{OUT}$.

A power supply 10 may provide a power supply voltage $V_{SUPPLY}$ to the power supply rail inputs of amplifier A1. Power supply 10 may comprise a charge pump power supply, a switching direct current-to-direct current converter, a linear regulator, or any other suitable power supply.

As discussed in greater detail elsewhere in this disclosure, predictive brownout prevention system 20 may be configured to prevent brownout of audio output signal $V_{OUT}$. As used herein, the term "brownout" broadly refers to an unintentional drop of one or more supply voltages within personal audio device 1, which may lead to improper or undesired operation of one or more components receiving such one or more supply voltages. To carry out this functionality, predictive brownout prevention system 20 may receive information indicative of an amplitude of digital audio input signal AUDIO_IN (e.g., by monitoring a characteristic indicative of an amplitude of digital audio input signal AUDIO_IN). Although many embodiments disclosed herein contemplate such monitoring as carried out by directly extracting amplitude information from digital audio input signal AUDIO_IN or a buffered version thereof, in other embodiments, such monitoring may be of any signal derivative of digital audio input signal AUDIO_IN (e.g., any signal within the signal path from digital audio input signal AUDIO_IN to audio output signal $V_{OUT}$). Predictive brownout prevention system 20 may also receive information indicative of a condition of power supply 10. In some embodiments, the condition of power supply 10 may be indicative of a maximum amplitude of audio output signal $V_{OUT}$ that may be output by amplifier A1 or a supply current consumed by amplifier A1 triggering a brownout condition occurring or violating a user-defined or other type of threshold indicating a brownout condition. As used throughout this disclosure, the term "brownout condition" may broadly refer to a condition or situation in which a brownout may actually occur, or a condition or situation wherein a brownout may potentially occur, based on parameters measured by predictive brownout prevention system 20, as described in greater detail elsewhere in this disclosure. In these and other embodiments, the condition of power supply 10 may be determined by at least one of power supply voltage $V_{SUPPLY}$, a current of power supply 10, an internal impedance of power supply 10, impedances external to power supply 10, and a predicted behavior of power supply 10 in response to loading conditions of power supply 10.

Predictive brownout prevention system 20 may determine from the physical quantity indicative of an amplitude of digital audio input signal AUDIO_IN and the information indicative of the condition of power supply 10 whether a brownout condition exists wherein the audio output signal $V_{OUT}$ would brownout responsive to digital audio input signal AUDIO_IN in the absence of attenuation within the signal path from digital audio input signal AUDIO_IN to audio output signal $V_{OUT}$. Responsive to determining the brownout condition exists, predictive brownout prevention system 20 may generate a selectable attenuation signal to reduce an amplitude of audio output signal $V_{OUT}$ such that the signal path attenuates digital audio input signal AUDIO_IN or a derivative thereof in order to prevent brownout prior to propagation to the audio output of amplifier A1 of a portion of digital audio input signal AUDIO_IN having the brownout condition. In some embodiments, such attenuation may include reducing an audio volume of digital audio input signal AUDIO_IN or a derivative thereof within the signal path.

In some embodiments, attenuation may include applying a non-linear gain to digital audio input signal AUDIO_IN or a derivative thereof within the signal path. In some embodiments, applying a non-linear gain may include clipping digital audio input signal AUDIO_IN or a derivative thereof to a maximum amplitude. For example, such attenuation or clipping may take place in a digital path portion of the signal path (e.g., between digital audio source 18 and DAC 14). Alternatively or in addition, such attenuation (whether linear or non-linear) or clipping may take place in an analog path portion of the signal path (e.g., between DAC 14 and the output node), such as by applying a variable gain to an output stage of DAC 14 and/or a variable gain to amplifier A1.

In these and other embodiments, as described in greater detail below, attenuation may include soft clipping the audio input signal or the derivative thereof with a gain transfer function whose mathematical derivative is a continuous function. For example, soft clipping may be applied by an arctangent filter to the audio input signal or the derivative thereof.

Figure 3:
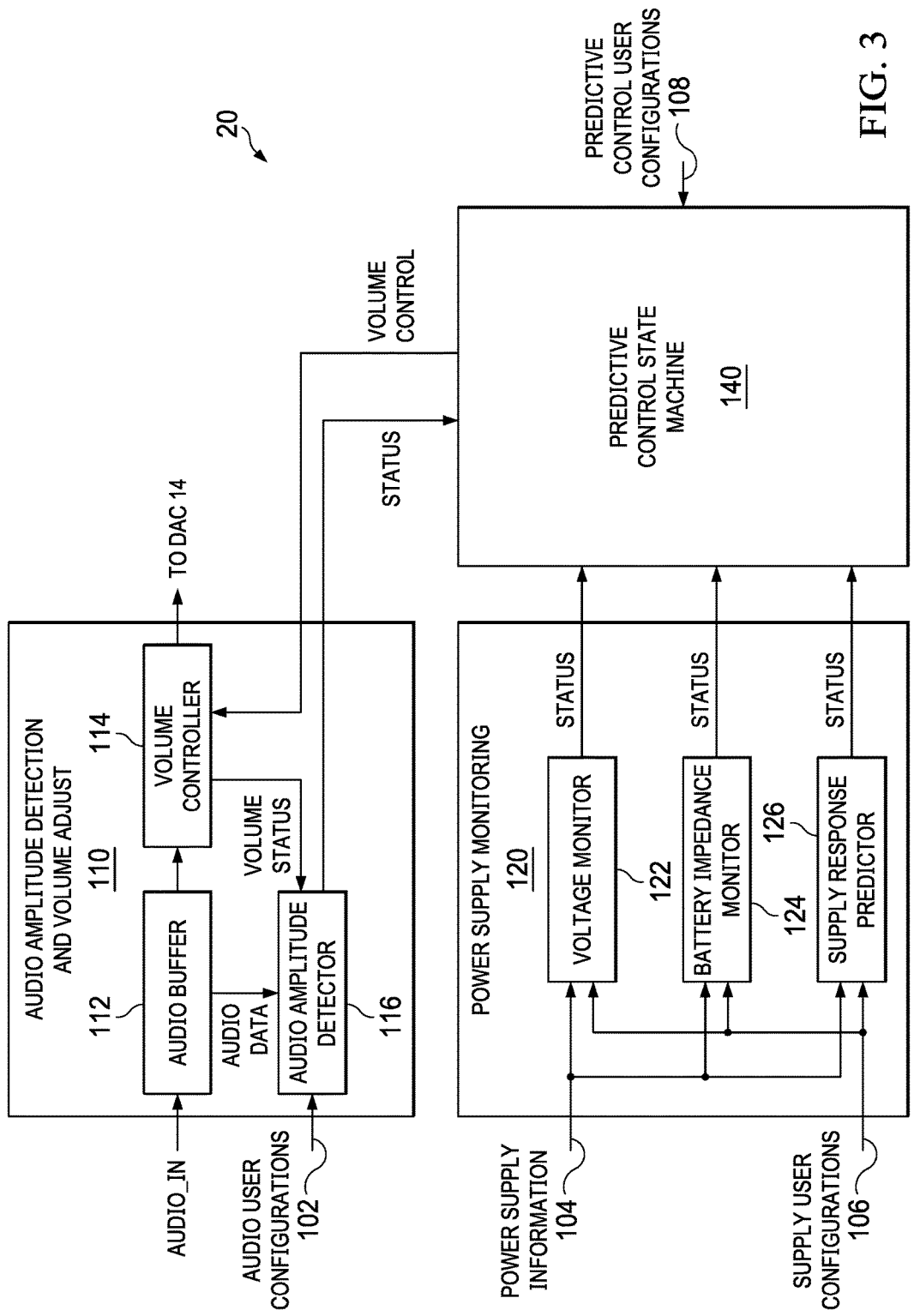
FIG. 3 is a block diagram of selected components of a predictive brownout prevention system for use within the audio integrated circuit depicted in FIG. 2, in accordance with embodiments of the present disclosure.

FIG. 3 is a block diagram of selected components of an example predictive brownout prevention system 20, in accordance with embodiments of the present disclosure. In the embodiments represented by FIG. 3, predictive brownout prevention system 20 may include an audio amplitude detection and volume adjust block 110, a power supply monitoring block 120, and a predictive control state machine block 140.

User configurations, including audio user configurations 102, supply user configurations 106, and/or predictive control user configurations 108 may be applied to volume adjust block 110, power supply monitoring block 120, and predictive control state machine block 140, respectively. Audio user configurations 102 may include, but are not limited to, the ability to manipulate audio amplitude detector 116. These user configurations may allow the user to set such detection parameters that include, but are not limited to, peak-level thresholds, root-mean-squares-level thresholds, frequencies and/or durations of concern, and/or the load impedance on the amplifier. Supply user configurations 106 may include, but are not limited to, the ability of the user to set various voltage, impedance, current consumption, and/or behavioral thresholds of the battery supply and/or power behavior characteristics of audio IC 9. These thresholds may allow the user to customize when a battery is considered to be in a weakened state of operation that may produce a voltage drop when under load. Predictive control user configurations 108 may allow the user the ability to manipulate the response of the predictive brownout prevention system 20. These may include, but are not limited to, volume adjustments, control delays, masking or weighting of supply information relative to the audio content, and what types and thresholds of audio content to predictively attenuate.

User configurability of predictive brownout prevention system 20 may be desirable as each different design of a portable audio device may have different parameters of concern, including without limitation different battery output voltages, different battery characteristics, a different audio amplifier, and/or a different audio load. This variation of the system requirements and parameters for different personal audio devices may dictate that the audio monitoring of amplitude detection and volume adjust block 110, the supply monitoring of power supply monitoring block 120, and control by predictive control state machine block 140 should be flexible, adaptable, and user configurable so that predictive brownout prevention may be appropriately optimized for each personal audio device. While user flexibility to "tune" a response of predictive brownout prevention system 20 may be desirable in some instances, in some embodiments, some or all of parameters associated with audio user configurations 102, supply user configurations 106, and/or predictive control user configurations 108 may be fixed to a specific set of values (e.g., by a provider of a personal audio device).

As shown in FIG. 3, power supply monitoring block 120 may comprise voltage monitor 122, battery impedance monitor 124, and supply response predictor 126. Voltage monitor 122 may be configured to receive power supply information 104 and perform a comparison of a voltage of a battery for supplying power for power supply 10 against, for example, a user-configurable threshold set within supply user configurations 106. A user may have the flexibility to determine such voltage threshold and adjust it based on the requirements of the other components within personal audio device 1. In some embodiments, multiple voltage thresholds may be set within supply user configurations 106, which would allow predictive control state machine 140 to monitor for and react to different levels of predictive audio loading from the audio amplitude detector 116.

Battery impedance monitor 124 may be configured to receive power supply information 104 and record recent loading conditions and track the effect of changes in current consumption which may produce corresponding changes in battery impedance. As a battery becomes "weaker" via its level of charge, discharge current, aging of the battery, and/or environmental effects, its output impedance may increase. Under no load, the battery's output impedance may have little effect on the battery's output voltage. However, the output impedance has a significant impact on the voltage produced on the output terminals of the battery when current is being provided. If power supply 10 comprises a direct current-to-direct current converter, such as a boost converter, buck converter, linear regulator, or charge pump, to regulate the $V_{SUPPLY}$ voltage to the amplifier A1, the direct current-to-direct current converter's characteristics may be encompassed as a part of the power supply information 104, battery impedance monitor 124, or supply response predictor 126.

Figure 4:
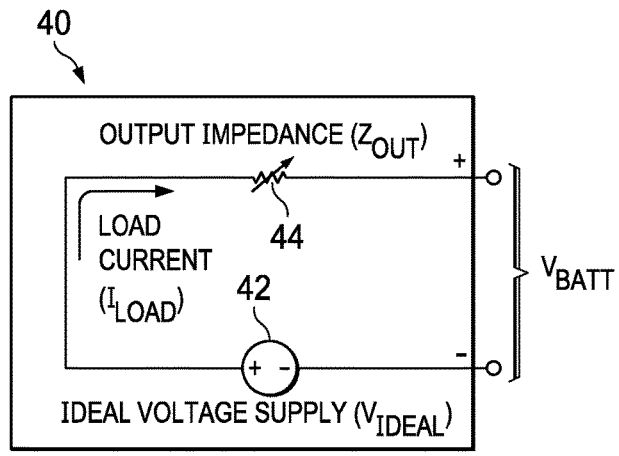
FIG. 4 is a circuit diagram of a model of an example battery, in accordance with embodiments of the present disclosure.
Figure 5:
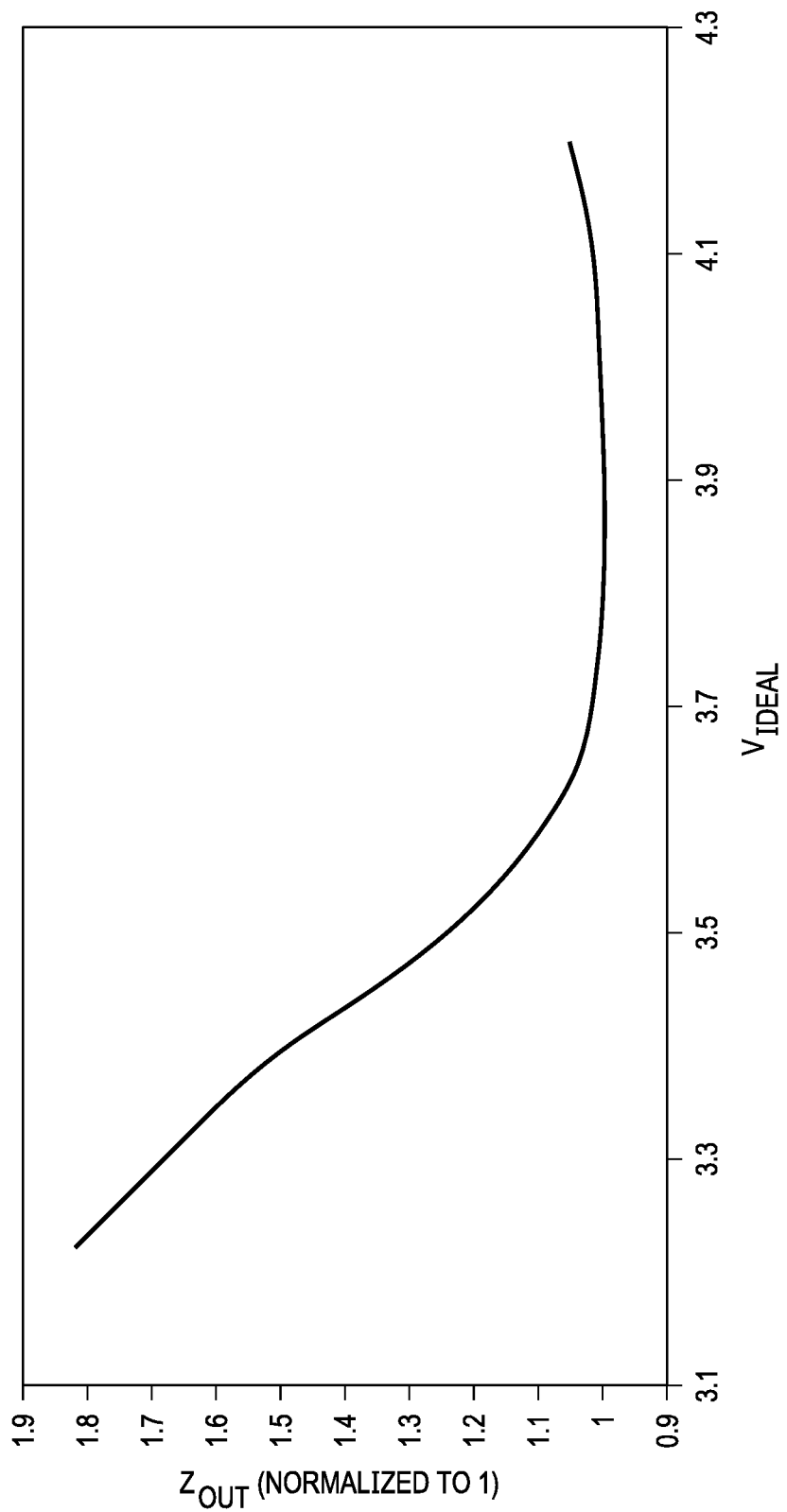
FIG. 5 is a graph showing an example relationship between output impedance and battery charge voltage of the model of the example battery depicted in FIG. 4, in accordance with embodiments of the present disclosure.

FIG. 4 is a circuit diagram of a model 40 of an example battery, in accordance with embodiments of the present disclosure. As shown in FIG. 4, a battery may be modeled as having an ideal voltage supply 42 outputting a voltage $V_{IDEAL}$ and an output impedance 44 with a variable impedance $Z_{OUT}$ which may vary due to change in level of battery charge, discharge current, aging of the battery, and/or environmental effects. FIG. 5 is a graph showing an example relationship between output impedance and battery charge voltage of the model 40 depicted in FIG. 4, in accordance with embodiments of the present disclosure, which shows that variable impedance $Z_{OUT}$ may vary due to change in level of battery charge. As current $I_{LOAD}$ delivered from a battery increases, the output voltage $V_{BATT}$ it generates (and which may be delivered to power supply 10 to provide power to elements of audio IC 9) may decrease. Battery impedance monitor 124 may monitor the variance of this variable impedance $Z_{OUT}$, and if applicable, an additional impedance external to the battery (e.g., those present on power supply voltage $V_{SUPPLY}$ to amplifier A1).

Supply response predictor 126 may be configured to receive power supply information 104 and predict future behavior of a battery supply under various loading conditions based on monitoring recent behavioral history of the battery supply. An audio amplifier (e.g., amplifier A1) may not have enough system-level visibility to be able to determine the total absolute loading on the battery supply at any given time. However, supply response predictor 126 may be able to determine what an amplifier's loading contribution is on a battery supply and monitor how the battery supply responds to the changes in loading produced by the amplifier. Such information enables supply response predictor 126 to estimate how large of a supply voltage drop may occur when a certain amount of current is consumed by amplifier A1. When the status of supply response predictor 126 is combined with status of voltage monitor 122, status of battery impedance monitor 124, and status of audio amplitude detector 116, predictive control state machine 140 may determine how large of an audio output signal $V_{OUT}$ may be produced by amplifier A1 without producing a large enough voltage drop in a battery powering amplifier A1 in order to trigger a brownout condition.

As shown in FIG. 3, audio amplitude detection and volume adjust block 110 may comprise an audio buffer 112, volume controller 114, and audio amplitude detector 116, and may be configured to monitor and manipulate the digital audio input signal AUDIO_IN or a derivative thereof. Portions of audio amplitude detection and volume adjust block 110 (e.g., audio buffer 112, volume controller 114) may be integral to the signal path from digital audio input signal AUDIO_IN to audio output signal $V_{OUT}$. In some embodiments, all or a portion of the functionality of audio amplitude detection and volume adjust block 110 may be integral to amplifier A1. In these and other embodiments, all or a portion of the functionality of audio amplitude detection and volume adjust block 110 may be implemented in software or firmware. Thus, one or more features of audio amplitude detection and volume adjust block 110 may be implemented as software or firmware, as one or more separate or integrated pieces of hardware relative to amplifier A1, or any combination thereof.

Audio buffer 112 may be any system, device, or apparatus that provides a delay to allow the audio amplitude detector 116 and/or predictive control state machine 140 adequate time to react prior to digital audio input signal AUDIO_IN propagating through the signal path. For example, audio buffer 112 may provide sufficient delay such that its delay plus the group delay of the signal path up to volume controller 114 is greater than the processing time of audio amplitude detector 116, predictive control state machine 140, and volume controller 114. In some embodiments, audio buffer 112 may comprise a memory. In these and other embodiments, audio buffer 112 may include an intrinsic group delay of an audio path, delay caused by audio processing, and/or other suitable delay.

In more robust audio amplifier systems, an audio data path memory buffer is often available as a part of another feature that may also need a look-ahead or some time for preprocessing. When this is the case, the same memory buffer can be utilized as audio buffer 112 for predictive brownout prevention as long as it is large enough and has sufficient delay to allow for processing of other components of predictive brownout prevention system 20.

In some embodiments, an overall delay within a signal path may be sufficiently large enough to allow for processing by components of predictive brownout prevention system 20. In such embodiments, audio buffer 112 may not be present.

In the embodiments represented by FIG. 3, audio amplitude detector 116 may monitor digital audio input signal AUDIO_IN entering audio buffer 112. In such embodiments, audio amplitude detector 116 may evaluate such audio data against one or more thresholds (e.g., set within audio user configurations 102) in order to identify any incoming audio signals that may produce a loading condition large enough to put a strain on the battery supply powering power supply 10, producing a voltage drop, and risking a brownout condition if such audio signal is reproduced by audio amplifier A1. A status determination generated by audio amplitude detector 116 and provided to predictive control state machine block 140 may be based on any number and type of parameters including, but not limited to, a physical quantity of the audio signal (e.g., frequency, peak amplitude, power, etc.), characteristics of amplifier A1 (e.g., efficiency), and/or load impedance of an output of amplifier A1.

Although FIG. 3 depicts audio amplitude detector 116 monitoring digital audio input signal AUDIO_IN, in other embodiments audio amplitude detector 116 may detect a derivative of digital audio input signal AUDIO_IN elsewhere within the signal path of audio IC 9.

Figure 6:
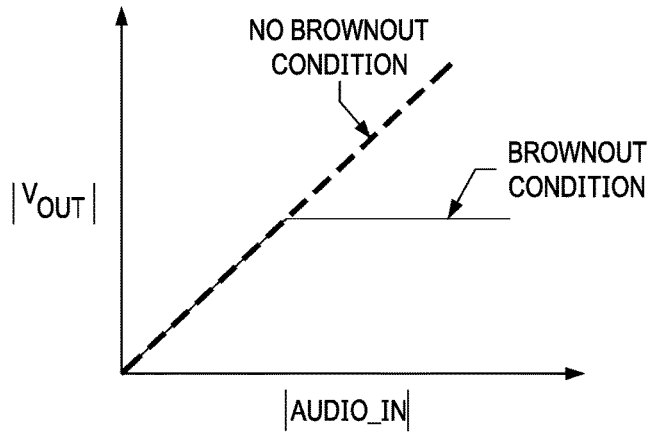
FIG. 6 is a graph of an example gain transfer function, in accordance with embodiments of the present disclosure.
Figure 7:
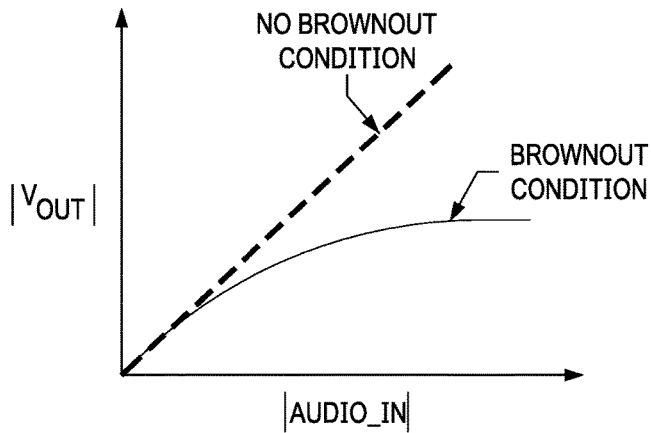
FIG. 7 is a graph of another example gain transfer function, in accordance with embodiments of the present disclosure.

Volume controller 114 may comprise any system, device, or apparatus configured to, based on a volume control signal generated by predictive control state machine 140, control a volume of or otherwise apply a selectable gain to the audio signal buffered by audio buffer 112 (e.g., prior to communication of the audio signal to DAC 14). Thus, in situations where predictive control state machine 140 determines a brownout condition exists, it may communicate the volume control signal, and in response thereto, volume controller 114 may attenuate the audio signal propagating through the audio signal path. In some embodiments, the volume controller 114 may attenuate the audio signal by reducing an audio volume of the audio signal. In these and other embodiments, the volume controller 114 may attenuate the audio signal in response to a brownout condition by applying a non-linear gain to the audio signal. For example, as shown in FIG. 6, volume controller 114 may apply "hard-clipping" to the audio signal in response to a brownout condition such that a gain transfer function (e.g., $f|V_{OUT}(|AUDIO\_IN|)|$) for the audio signal may be such that the mathematical derivative of the gain transfer function includes at least one point of discontinuity. As another example, as shown in FIG. 7, volume controller 114 may apply "soft-clipping" to the audio signal in response to a brownout condition such that the gain transfer function for the audio signal may be such that the mathematical derivative of the gain transfer function is a continuous function. Such a soft-clipping gain transfer function may be implemented in any suitable manner, including by applying an arctangent filter to the audio signal.

As shown in FIG. 3, predictive control state machine 140 may receive status information from audio amplitude detector 116, voltage monitor 122, battery impedance monitor 124, and supply response predictor 126 and, based on such status information, determine whether to attenuate (e.g., reduce an audio volume via volume controller 114) digital audio input signal AUDIO_IN (or a derivative thereof) in order to protect from a battery supply voltage drop that might occur if such signal were not attenuated. In addition, once in a state in which brownout-prevention attenuation is taking place, predictive control state machine 140 may, based on such status information, determine whether to allow audio signal amplitude to return to its non-attenuated level.

If the statuses of voltage monitor 122, supply response predictor 126, and battery impedance monitor 124 indicate that the battery is in a weakened state and audio amplitude detector 116 indicates that a high loading condition is about to occur, predictive control state machine 140 may react by communicating an appropriate volume control signal to volume controller 114, causing volume controller 114 to attenuate the audio signal. Accordingly, by the time an audio signal potentially causing brownout is communicated to amplifier A1, it may be attenuated to a level sufficiently low enough to prevent brownout.

Figure 8:
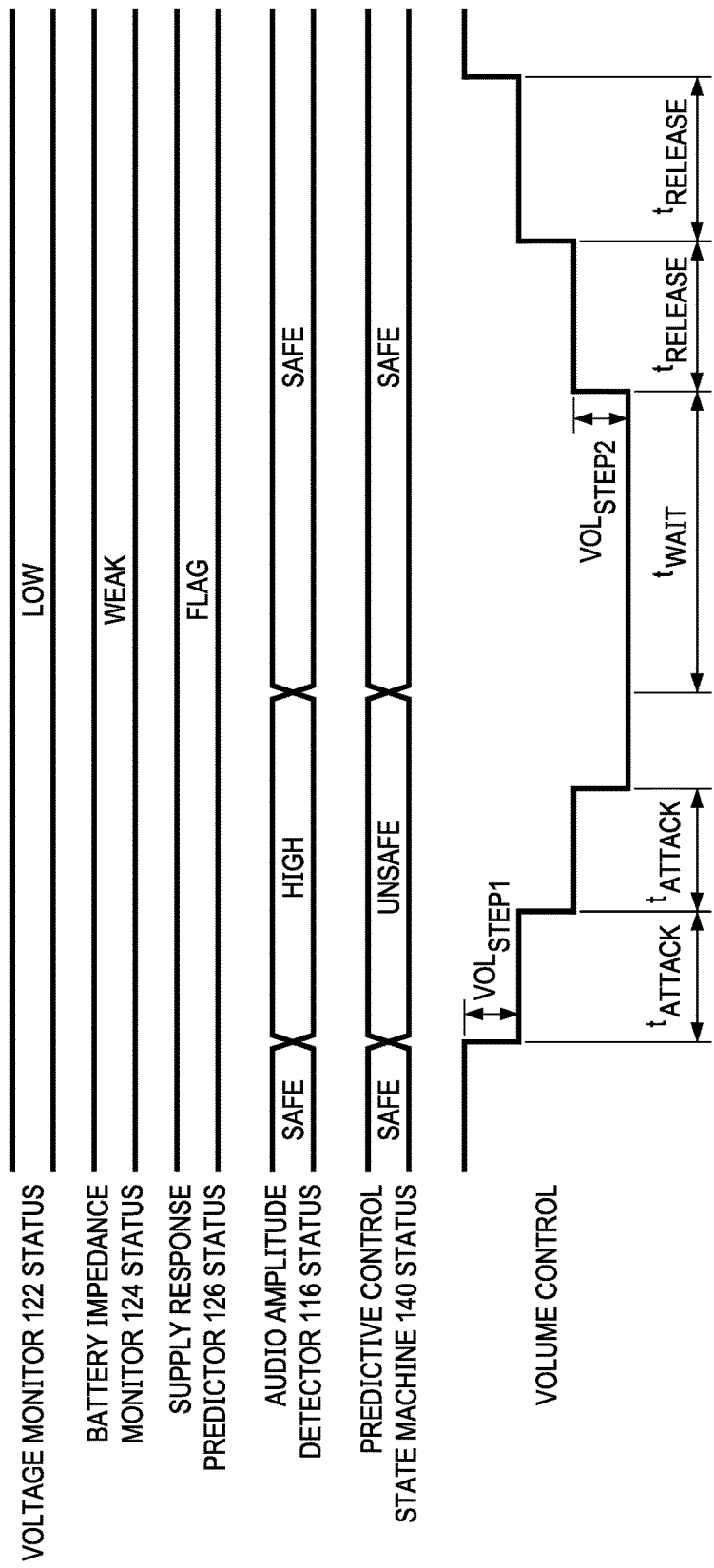
FIG. 8 is a graphical representation of various signals versus time that may be present when a predictive brownout control system triggers attenuation of an audio signal to prevent brownout, in accordance with embodiments of the present disclosure.

FIG. 8 is a graphical representation of various signals versus time that may be present when a predictive brownout control system triggers attenuation of an audio signal to prevent brownout, in accordance with embodiments of the present disclosure. In FIG. 8, statuses of voltage monitor 122, battery impedance monitor 124, and supply response predictor 126 are shown as indicating that a battery powering power supply 10 is in a state weak enough such that it is not able to support the incoming audio signal AUDIO_IN without triggering a brownout condition once the audio signal propagates to amplifier A1 and loads down the battery powering power supply 10. This may cause predictive control state machine 140 to generate an appropriate volume control signal to attenuate the audio signal responsive to analyzing information received from audio amplitude detector 116 and power supply monitoring 120 (e.g., responsive to an indication that an audio amplitude is above a threshold level likely to cause a brownout condition). In some embodiments, the audio signal may be attenuated in amplitude steps of $VOL_{STEP1}$ for each time period $t_{ATTACK}$ that the audio amplitude of the audio signal monitored by audio amplitude detector 116 remains above the threshold. Once the audio amplitude of the audio signal monitored by audio amplitude detector 116 falls below the threshold (or another threshold), the attenuation may be continued for a period $t_{WAIT}$, after which the audio signal may be unattenuated in steps of $VOL_{STEP2}$ for each time period $t_{RELEASE}$ until returning to a normal state of operation with little or no audio attenuation.

Figure 9:
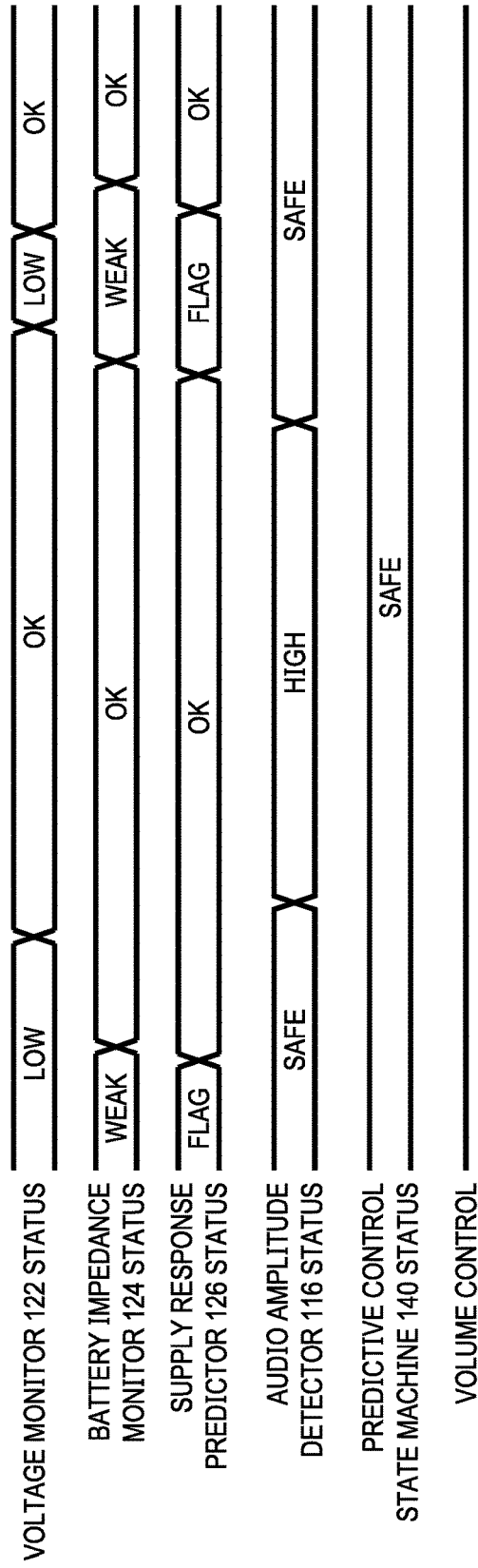
FIG. 9 is a graphical representation of various signals versus time that may be present when a predictive brownout control system does not trigger attenuation of an audio signal to prevent brownout, in accordance with embodiments of the present disclosure.

FIG. 9 is a graphical representation of various signals versus time that may be present when a predictive brownout control system does not trigger attenuation of an audio signal to prevent brownout, in accordance with embodiments of the present disclosure. As shown in FIG. 9, audio amplitude detector 116 indicates that an audio amplitude is below a threshold level likely to cause a brownout condition. However, in the scenario presented in FIG. 9, large audio amplitudes may only be present when voltage monitor 122, battery impedance monitor 124, and/or supply response predictor 126 report that power supply 10 is capable of handling the loading caused by such audio amplitude. Such large audio amplitudes may not occur when a battery powering power supply 10 is in a weakened state, as indicated by statuses of voltage monitor 122, battery impedance monitor 124, and/or supply response predictor 126. Accordingly, under this set of circumstances, predictive control state machine 140 may not cause attenuation of the audio signal.

Figure 10:
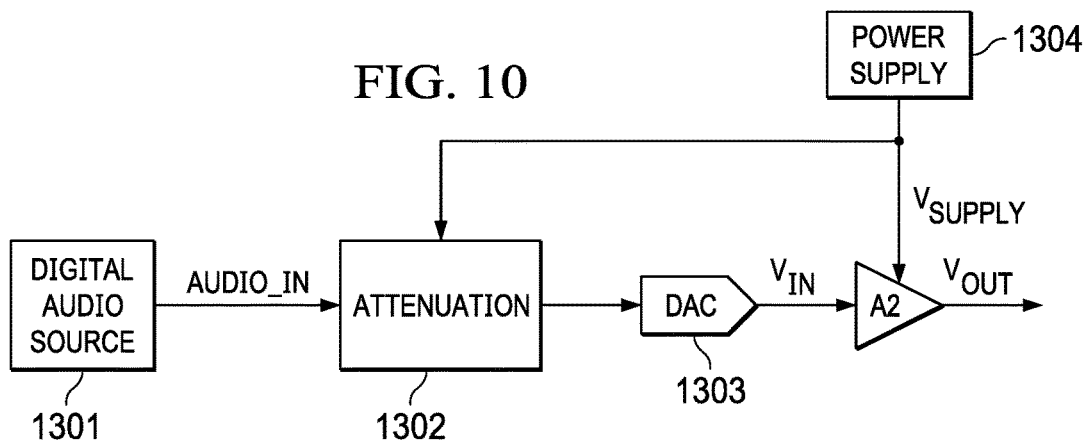
FIG. 10 is a block diagram of selected components of an example audio integrated circuit of a personal audio device, in accordance with embodiments of the present disclosure.

FIG. 10 is a block diagram of selected components of an example audio IC 1300 of a personal audio device, in accordance with embodiments of the present disclosure. The apparatus comprises a signal path having an audio input configured to receive an audio input signal AUDIO_IN, an audio output configured to provide an audio output signal $V_{OUT}$, a power supply input configured to receive a power supply voltage $V_{SUPPLY}$, and an attenuation block 1302. The attenuation block 1302 is configured to receive information indicative of one or more of the following: 1) adaptive estimates of power supply conditions; 2) anticipated effects of power supply capacitance; and 3) at least one condition of a complex load impedance. In response to determining from the received information that a portion of the audio output signal may reach a maximum power threshold, the attenuation block 1302 may generate a selectable attenuation signal to reduce an amplitude of at least a portion of the audio output signal such that the signal path attenuates the audio input signal or a derivative thereof in order to prevent brownout prior to propagation to the audio output of the portion of the audio input signal. The information indicative of adaptive estimates of the power supply conditions may comprise information regarding a voltage component and a resistive component received from an adaptive battery model as described in FIG. 14. Such a voltage component and a resistive component may be used to calculate the maximum power threshold. Similarly to FIG. 2 and as shown in FIG. 10, a digital audio source 1301 (e.g., a processor, digital signal processor, microcontroller, test equipment, or other suitable digital audio source) may supply a digital audio input signal AUDIO_IN to an attenuation block 1302, which may process digital audio input signal AUDIO_IN and provide such processed signal to a digital-to-analog converter (DAC) 1303, which may in turn supply an analog audio input signal $V_{IN}$ to a power amplifier stage A2 which may amplify or attenuate the audio input signal $V_{IN}$ and provide an audio output signal $V_{OUT}$, which may operate a speaker, headphone transducer, and/or a line level signal output. Although amplifier A2 is depicted as a single-ended output generating a single-ended audio output signal $V_{OUT}$, in some embodiments, amplifier A2 may comprise a differential output, and may thus provide a differential audio output signal $V_{OUT}$. A power supply 1304 may provide a power supply voltage $V_{SUPPLY}$ to the power supply rail inputs of amplifier A2. Power supply 1304 may comprise a charge pump power supply, a switching direct current-to-direct current converter, a linear regulator, or any other suitable power supply.

It will be appreciated that IC 1300 may also comprise a predictive brownout prevention system as previously described with reference to FIGS. 2 and 3.

In some embodiments, some or all of the functionality of the attenuation block may be integral to the amplifier A2.

In FIG. 10 amplifier A2 may receive an audio input signal $V_{IN}$ and may apply a gain to increase signal amplitude usually in the form of a voltage. For audio and haptic amplifiers, high electrical currents may result Amplifier A2, when treated as a voltage amplifier, may typically behave as a scaling of audio input signal AUDIO_IN and may have frequency effects, such as high-pass or low-pass filtering. Without loss of generality, amplifier A2 may receive the input voltage $V_{IN}$ and may provide a gain to provide the amplified output voltage $V_{OUT}$. By knowing the load impedance, the current output of amplifier A2 is known through Ohm's law (which applies also to complex impedances by convolution). With both voltage and current known, attenuation block 1302 may calculate the demand power of the amplifier as the product of the voltage and the current.

Amplifier A2 may be considered a power converter, which in reality will have a less than perfect power conversion ratio. Attenuation block 1302 may estimate the demand power of amplifier A2 and the efficiency of amplifier A2, and from this estimate calculate the electrical characteristics at the amplifier input $V_{IN}$, supply voltage $V_{SUPPLY}$ and supply input current. Inserting the estimated amplifier demand power into a battery model with a capacitance element will mimic the behavior of many real-world amplifier circuit configurations. In this example, a simple battery model is utilized; however, an adaptive battery model may be used as described in reference to FIG. 14. The effects of supply voltage $V_{SUPPLY}$ may then be modeled using audio input signal AUDIO_IN. Audio input signal AUDIO_IN may require attenuation to ensure supply voltage $V_{SUPPLY}$ remains above a threshold value, $V_{THRESH}$. This attenuation may be calculated by attenuation block 1302.

For resistive loads, current and voltage may be in phase. However, for loads with reactance, such as a loudspeaker, the real power required for a particular frequency may be less than the product of the root-mean-square voltage and current. This lower power requirement means that less attenuation is needed to ensure that the voltage (or current) threshold is met but not exceeded, and for example, allows for more power to be delivered to the load, resulting in higher sound pressure level for speakers, and vibrational intensity for haptic systems.

For a given audio input signal AUDIO_IN, attenuation block 1302 may utilize an estimate of the complex load impedance ($Z_{LOAD}$), and an estimate of pulse code modulated-to-$V_{IN}$ transfer function (usually a scaling constant H), to calculate the demand power needed by amplifier A2 ($P_{LOAD}$) to amplify audio input signal AUDIO_IN using the following equation:

$$P_{LOAD} = \text{Voltage} * \text{Current}, \quad (1)$$

where Voltage=AUDIO_IN*H and Current=Voltage/$Z_{LOAD}$. Due to inefficiencies of amplifier A2, the source power demanded by amplifier A2 to amplify the signal may be larger than the needed power $P_{LOAD}$. A source power $P_{SRC}$ is set to be the source power demanded by amplifier A2. Source power $P_{SRC}$ relates to $P_{LOAD}$ by the efficiency parameter n, which is between 0 and 1:

$$P_{SRC} = P_{LOAD}/n \qquad (2)$$

The estimate of the power demanded by amplifier A2 may be used, along with the estimates of the voltage component ($V_{BATT}$), the resistor component ($R_{BATT}$), and the power supply capacitance ($C_{BULK}$) to predict the power supply voltage. In particular, for a given battery model, the maximum power that can be sourced while staying above a voltage threshold $V_{THRESH}$ can be computed by solving the simultaneous system of equations relating the battery model to the power needed by the amplifier.

$$V_{SUPPLY} = (V_{BATT} + \text{SQRT}(V_{BATT}^2 - 4 \ast P_{SRC} \ast R_{BATT}))/2, \qquad (3)$$

where $V_{BATT}$ is the battery model voltage and $R_{BATT}$ is the battery model resistance. With this equation, the effects on the power supply voltage $V_{SUPPLY}$ can be predicted as a function of the source power demanded by the amplifier, $P_{SRC}$. If the power supply voltage $V_{SUPPLY}$ is to stay above a threshold, then the maximum power allowed for source power $P_{SRC}$ can be determined. With the maximum allowed power known, and the ability to estimate the power demand from the audio input signal AUDIO_IN, the audio input signal AUDIO_IN may now be attenuated to satisfy the maximum power allowed condition.

In physical systems, capacitance effects can complicate the prediction of the power supply voltage $V_{SUPPLY}$ due to the capacitance momentarily supplying current rather than the battery. A simple approximation to the capacitance effect is to instead apply a low-pass filter to the estimated power demanded by the amplifier, and this low-pass filter has a time-constant of approximately $R_{BATT} \ast C_{BULK}$, where $R_{BATT}$ is the resistance of the battery model and $C_{BULK}$ is the bulk capacitance in parallel to the power supply. Therefore, the information indicative of the anticipated effects of the power supply capacitance ($C_{BULK}$) may be used to optionally apply a linear filter operating on the predicated power supply voltage.

In order to ensure that the gain applied to the input audio signal actually protects the system from brownout, the gain may be applied earlier than needed, i.e., at a voltage threshold above where brownout would actually occur, and maintained. In order to preserve causality, the audio input signal AUDIO_IN must be delayed, as well as its gain computation, in order to look ahead and apply the needed gain signal earlier.

With the power demand known, the maximum power allowed, i.e., the maximum power threshold for the audio input signal $P_{MAX}$, can be calculated from equation (3) by replacing the $V_{SUPPLY}$ with $V_{THRESH}$ using the parameter estimates of the battery model and rearranging to give the following equation:

$$P_{MAX} = (V_{THRESH} \ast V_{BATT} - V_{THRESH}^2)/R_{BATT}, \qquad (4)$$

wherein $V_{THRESH}$ is the target minimum voltage value for power supply voltage $V_{SUPPLY}$ that is allowed. Using the maximum allowed power $P_{MAX}$ and the estimate of the amplifier power demand $P_{SRC}$, the gain G, required to satisfy the condition that the supply voltage $V_{SUPPLY}$ must remain greater than $V_{THRESH}$ is:

$$G = \min\left(\frac{P_{MAX}}{P_{SRC}}\right)^{\frac{1}{2}} \qquad (5)$$

With the gain value known, the protected signal amplitude is now known. This gain can be applied by the attenuation block to the broadband signal or to a summation of bandpass-filtered signals which comprises the broadband signal. For the bandpass-filtered signals, each band's gain value may be adjusted, as long as the summation remains the same, which allows for a multiband compression ability.

The notion of attack and release times refers to the rate at which the applied gain approaches the required gain to prevent brownout. These attack and release rates can be configured, typically in units of dB/second.

In order to avoid excess current demands from the battery causing a low-voltage condition, capacitors may be added in parallel to power supply 1304 in order to buffer momentary current spikes. These capacitors may act as low-pass filters on the supply voltage $V_{SUPPLY}$. In physical systems, this capacitance may also be augmented by parasitic effects of connecting multiple components to power supply 1304 due to their input capacitances, wiring topology, etc.

Amplifier A2, in the presence of this bulk capacitance, may pull current from the capacitor and the battery, which means that there may be less of a voltage drop as compared to the system without bulk capacitance. By considering the effects of this bulk capacitance, the power demands on the battery supply may be computed more accurately by the attenuation block, and less attenuation on the audio input signal AUDIO_IN may be applied while still ensuring that brownout conditions do not occur.

Figure 11:
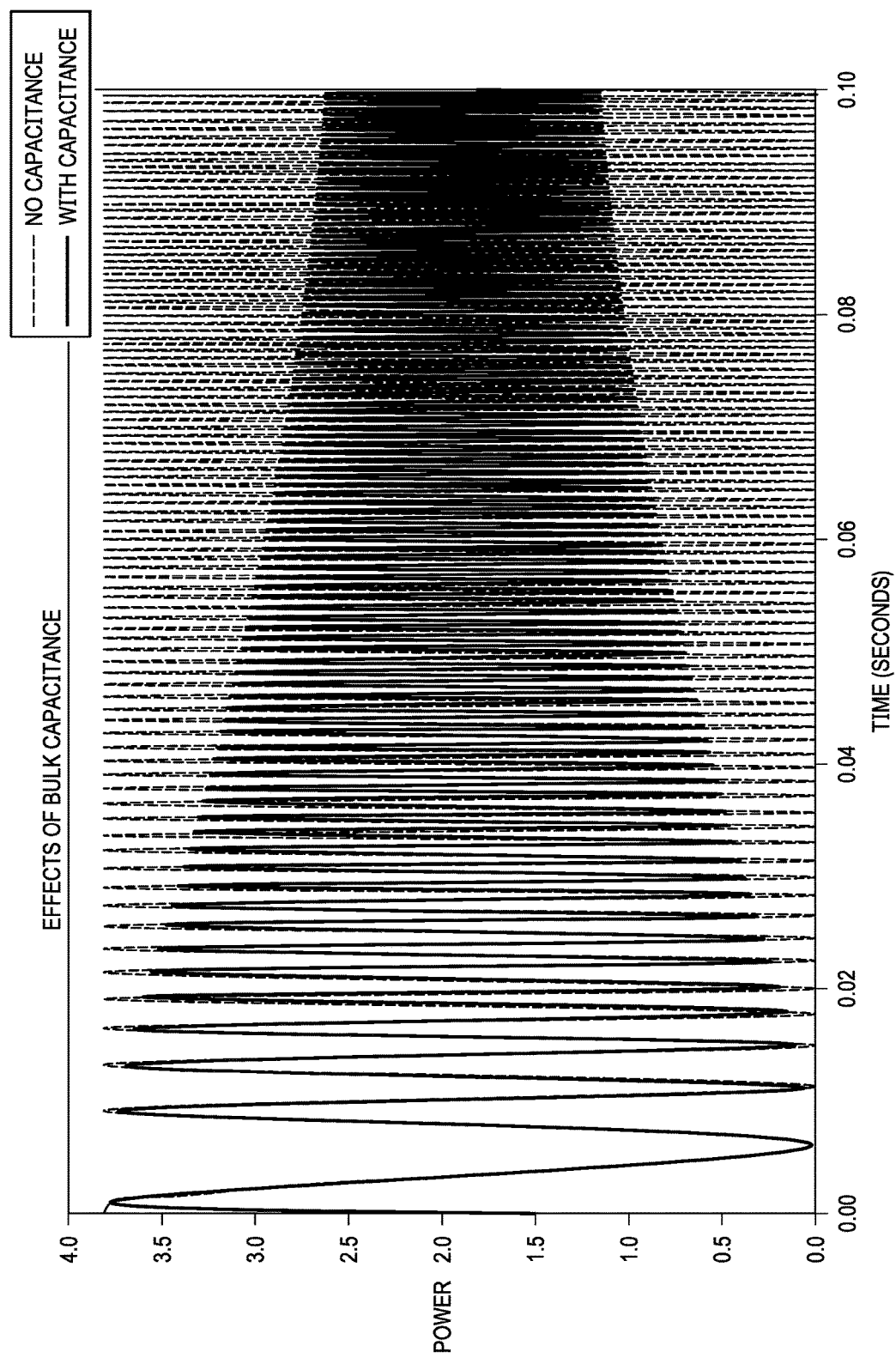
FIG. 11 is a plot diagram of power versus time depicting the effects of bulk capacitance on a chirp signal, in accordance with embodiments of the present disclosure.

FIG. 11 is a plot diagram of power plotted against time that shows the effects of bulk capacitance on a chirp signal, in accordance with embodiments of the present disclosure. FIG. 11 shows frequency of the chirp signal increasing with time. At higher frequencies, the bulk capacitance may cause less of a power demand.

As described previously, FIG. 4 shows an example battery model. The battery model, for example as shown in FIG. 4 (e.g., and may be used as power supply 10 in FIG. 2), comprises a Thevenin circuit of a battery voltage $V_{BATT}$ with an output impedance $Z_{OUT}$ or a series battery resistance $R_{BATT}$ which is a subset of output impedance $Z_{OUT}$. As system current demand increases, available voltage decreases due to series battery resistance $R_{BATT}$, where $V_{SUPPLY} = V_{BATT} - R_{BATT} \ast I_{SUPPLY}$. Using only the $V_{SUPPLY}$ signal, the battery voltage $V_{BATT}$ and battery resistance $R_{BATT}$ signals may be inferred for a changing $I_{SUPPLY}$ signal (that is, changing current demand based on the load impedance), which in the case of amplifier A1, the demand current $I_{SUPPLY}$ would be the amplifier input current $I_{SUPPLY}$.

If there is no signal to amplify, which translates to no input current ($I_{SUPPLY}$=0), then supply voltage $V_{SUPPLY}$ reveals the effective battery voltage $V_{BATT}$. If other parts of the system, which are separate from amplifier A2, draw current, such as a radio or a light emitting diode (LED), there may be a supply voltage drop. From the point of view of the battery model for amplifier A2, this supply voltage drop amounts to a reduced effective battery voltage $V_{BATT}$.

When there is a signal for amplifier A2 which generates current draw, there may be a drop in supply voltage $V_{SUPPLY}$. This supply voltage drop may be proportional to battery resistance $R_{BATT}$. By using an estimate of the power supply voltage $V_{SUPPLY}$ for the given amplifier audio input signal AUDIO_IN, a comparison may be made between the actual and predicted signals to adjust the estimates of battery resistance $R_{BATT}$. This may improve the accuracy of the battery model and hence may result in less unnecessary attenuation of the audio signal.

Because of capacitance effects, group delay may be introduced into the actual supply voltage $V_{SUPPLY}$ relative to the estimated supply voltage $V_{SUPPLY}$ signal. This compensation may require knowing the group delay effects precisely, and slight phase errors may amplify or attenuate the difference between supply voltage $V_{SUPPLY}$ and the predicted or estimated supply voltage $V_{EST\_SUPPLY}$. In order to avoid these phase effects, envelope predictions or estimations may be used.

If the battery model matches the real system, then the envelopes of the actual supply voltage $V_{SUPPLY}$ and predicted or estimated supply voltage $V_{SUPPLY}$ signals may be nearly identical. However, deviations may then reveal a mismatch between reality and the model and require a corrective response.

Figure 12:
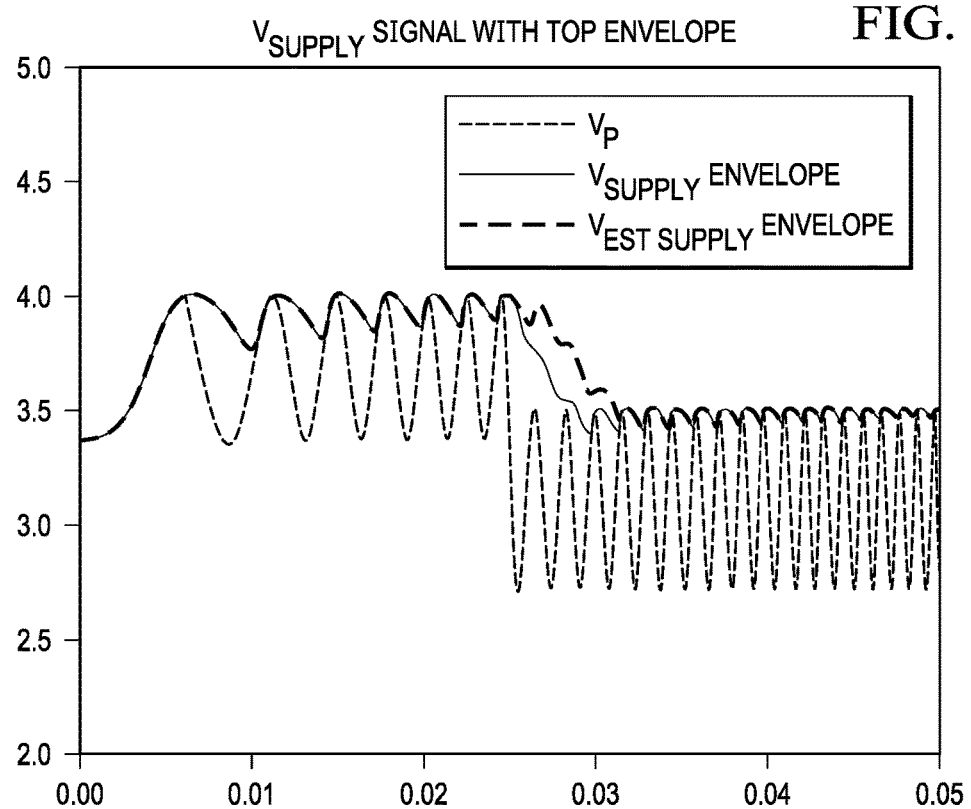
FIG. 12 is a graphical representation of a bottom-side envelope of a supply voltage, in accordance with embodiments of the present disclosure.

In FIG. 12, the bottom-side or bottom envelope of the supply voltage $V_{SUPPLY}$ signals may provide information regarding the value of battery resistance $R_{BATT}$. Hypothetically, if battery resistance $R_{BATT}$ were zero, then the bottom envelope and top envelope of the supply voltage $V_{SUPPLY}$ would be the same. However, as the battery resistance $R_{BATT}$ is not zero, the bottom envelope will be lower than the upper envelope as shown by the respective dotted lines $V_{SUPPLY}$ and $V_{EST\_SUPPLY}$.

If the predicted supply voltage $V_{EST\_SUPPLY}$ does not fall as far as the measured supply voltage $V_{SUPPLY}$ signal, then battery resistance $R_{BATT}$ must be increased, and vice-versa, to correct for over-estimations in battery resistance $R_{BATT}$.

In FIG. 13, the upper side or top envelope of supply voltage $V_{SUPPLY}$ signals may be used for adapting the battery voltage $V_{BATT}$ estimate. The peaks of supply voltage $V_{SUPPLY}$ may provide the closest values to the actual battery voltage $V_{BATT}$ value. If the predicted peaks and actual peaks differ, then battery voltage $V_{BATT}$ may need correction.

The presence of bulk capacitance confounds the battery voltage $V_{BATT}$ and the battery resistance $R_{BATT}$ adaptation, bulk capacitance for a particular frequency can be simultaneously seen as a reduction in battery voltage $V_{BATT}$ and battery resistance $R_{BATT}$. By including bulk capacitance in the power estimation, battery voltage $V_{BATT}$ and battery resistance $R_{BATT}$ estimates may become even more accurate, further reducing any unnecessary attenuation of the audio signal.

FIG. 14 illustrates an example of an adaptive battery model 1600 which may be included within or separate to attenuation block 1302 and/or amplifier A2. Battery model 1600 may comprise an envelope tracker 1601 which may be configured to receive supply voltage $V_{SUPPLY}$ and the estimate of supply voltage $V_{EST\_SUPPLY}$. Envelope tracker 1601 may track the upper-side envelope of supply voltage $V_{SUPPLY}$ in first tracking block 1602 and compare the peaks of the resulting envelope to the upper-side envelope of the predicted supply voltage upper-side envelope from second tracking block 1603. The comparison may be used to update the $V_{BATT}$ value in update block 1604. Third tracking block 1605 may track the bottom-side envelope of supply voltage $V_{SUPPLY}$ and compare the local minimums of the resulting envelope to the bottom-side envelope of the predicted supply voltage from fourth tracking block 1606. The comparison is used to update the $R_{BATT}$ value in update block 1607. The updated values of $R_{BATT}$ and $V_{BATT}$ may be provided to attenuation block 1302 for calculating the maximum power threshold.

As the audio input signal AUDIO_IN increases in amplitude, more power supply current is needed to provide amplification. Too much power supply current can lead to a brownout condition. The amplitude of audio input signal AUDIO_IN must be attenuated to avoid brownout. A dynamic range compressor and limiter can attenuate and limit the power supply current.

The embodiments of the present disclosure further: 1) provides an adaptive estimate of battery conditions; 2) anticipate effects of power supply capacitance, and 3) use a complex impedance model of load (rather than a resistor) to determine needed power, since load reactance lowers needed power (e.g., condition of load impedance).

Figure 15:
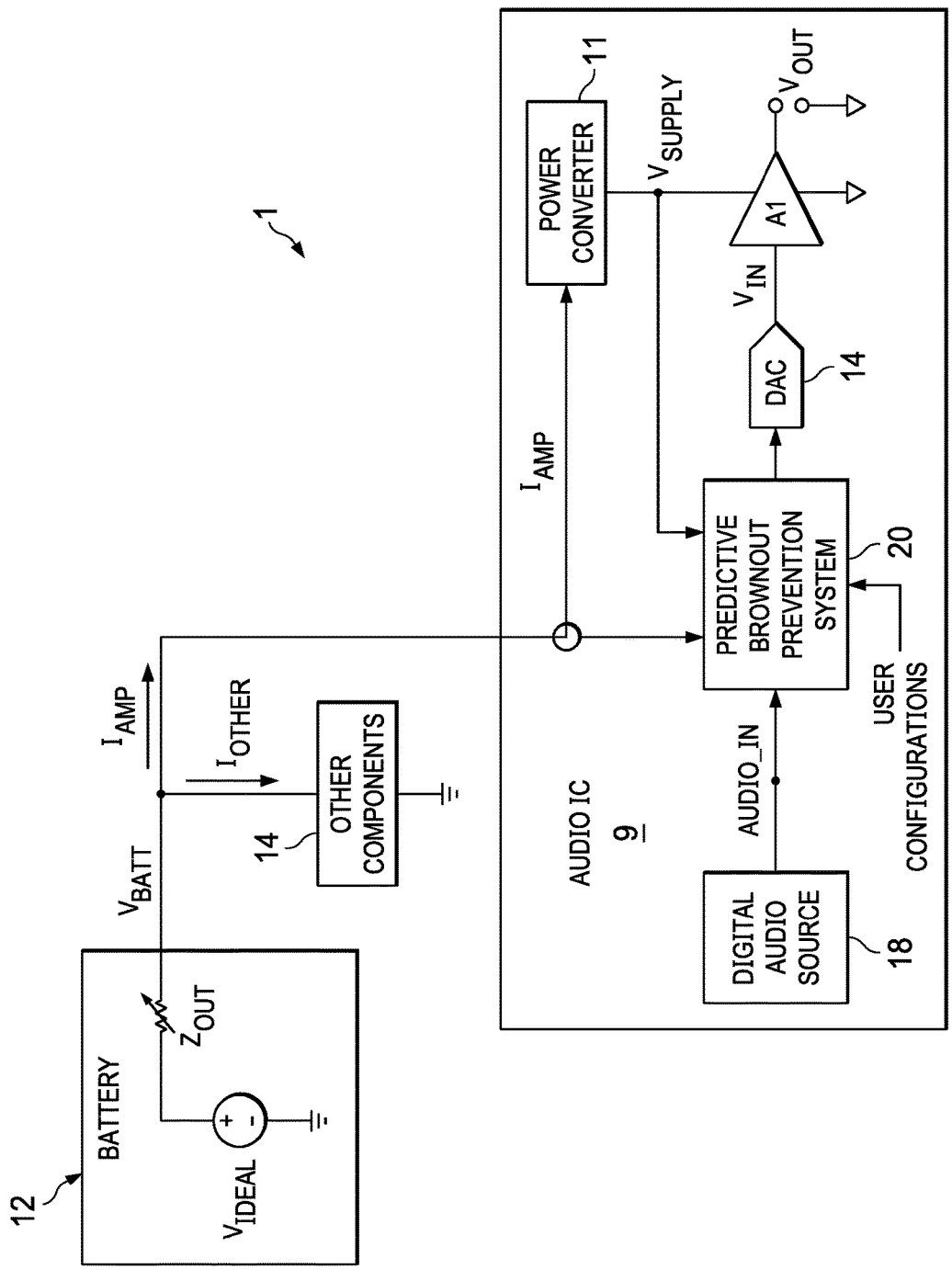
FIG. 15 is a block diagram of selected components of a personal audio device, in accordance with embodiments of the present disclosure.

As an example of an application of predictive brownout prevention system 20, reference is made to FIG. 15. FIG. 15 is a block diagram of selected components of a personal audio device 1, in accordance with embodiments of the present disclosure. As shown in FIG. 15, personal audio device 1 may include an audio IC 9 similar to that depicted in FIG. 2, wherein power source 10 of FIG. 2 may be implemented with a battery and a power converter 11 for providing electrical energy to audio IC 9 and other components 14. Battery 12, as shown in FIG. 15, is modeled in accordance with battery model 40 of FIG. 4 to have an ideal voltage $V_{IDEAL}$ and an output impedance $Z_{OUT}$.

Power converter 11 may comprise and suitable direct-current-to-direct-current converter for generating supply voltage $V_{SUPPLY}$ as a multiple of battery output voltage $V_{BATT}$. Power converter 11 may comprise a boost converter, charge pump, buck converter, or any other suitable type of power converter. In some embodiments, power converter 11 may not be present, and amplifier A1 may draw electrical energy directly from battery 12.

Dependent upon a current drawn from battery 12, battery 12 generates an output voltage $V_{BATT}$. Applying Ohm's law:

$$V_{BATT}=V_{IDEAL}-(I_{OTHER}+I_{AMP})*Z_{OUT}$$

Where $I_{AMP}$ equals a current delivered from battery 12 to power converter 11, and $I_{OTHER}$ represents the remainder of current delivered from battery 12 to other components 14. Rewriting the above equation:

$$V_{BATT}=V_{IDEAL}-I_{OTHER}*Z_{OUT}-I_{AMP}*Z_{OUT}$$

From the above equation, an apparent ideal voltage $V_{IDEAL'}$ can be defined as:

$$V_{IDEAL'}=V_{IDEAL}-I_{OTHER}*Z_{OUT}$$

such that:

$$V_{BATT}=V_{IDEAL'}-I_{AMP}*Z_{OUT}$$

As shown in FIG. 15, predictive brownout prevention system 20 may readily be able to measure or sense output voltage $V_{BATT}$ and current $I_{AMP}$, but may not be able to readily measure current $I_{OTHER}$. However, predictive brownout prevention system 20 may be able to prevent brownout by taking into account loading events of power supply 10 on battery 12 (e.g., current $I_{AMP}$ delivered to power supply 10 and output voltage $V_{BATT}$ available to power supply 10), but ignoring loading events of other components 14 on battery 12. To do this, predictive brownout prevention system 20 may ignore current $I_{OTHER}$, and instead assume that power supply 10 is supplied by a battery modeled as having an apparent ideal voltage $V_{IDEAL'}$ in lieu of ideal voltage $V_{IDEAL}$, and a variable output impedance $Z_{OUT}$, and adaptively update an apparent ideal voltage $V_{IDEAL'}$ of the battery model and variable output impedance $Z_{OUT}$ of the battery model based on various measured parameters of audio IC 9, as explained in more detail above.

Thus, when current $I_{OTHER}$ increases, apparent ideal voltage $V_{IDEAL'}$ may decrease and predictive brownout prevention system 20 may reduce maximum current draw of current $I_{AMP}$, and when current $I_{OTHER}$ decreases, apparent ideal voltage $V_{IDEAL'}$ may increase and predictive brownout prevention system 20 may increase maximum current draw of current $I_{AMP}$.

To further illustrate, predictive brownout prevention system 20 may directly measure current $I_{AMP}$ and measure output voltage $V_{BATT}$ and based on changes to the measured current $I_{AMP}$ and and/or measures output voltage $V_{BATT}$, refine estimates for impedance $Z_{OUT}$ and apparent ideal voltage $V_{IDEAL'}$ of the battery model, thus providing accuracy for the battery model and robustness to loading events related to current $I_{OTHER}$.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus for providing an audio output signal to an audio transducer, comprising a signal path comprising:
   an audio input configured to receive an audio input signal;
   an audio output configured to provide an audio output signal;
   a power supply input configured to receive a power supply voltage; and
   an attenuation block configured to:
      receive information indicative of adaptive estimates of power supply conditions, wherein the information indicative of adaptive estimates of the power supply conditions comprises information regarding a voltage component and a resistive component received from an adaptive battery model of a battery for providing electrical energy to a power supply for generating the power supply voltage;
      adapt the adaptive battery model based on a monitored battery voltage output by the battery and loading events of the signal path and excluding loading events of components other than the signal path which are powered from the battery; and
      in response to determining that a portion of the audio input signal has reached a maximum power threshold, generate a selectable attenuation signal to reduce an amplitude of the audio output signal such that the signal path attenuates the audio input signal or a derivative thereof in order to prevent brownout prior to propagation to the audio output of the portion of the audio input signal.

2. The apparatus of claim 1, further comprising:
   a predictive brownout prevention system configured to prevent brownout of the audio output signal, wherein the predictive brownout prevention system is configured to:
      receive information indicative of an amplitude of the audio input signal;
      receive information indicative of a condition of the power supply;
      determine from the received information whether a brownout condition exists; and
      in response to determining that a brownout condition exists, instruct the attenuation block to generate the selectable attenuation signal.

3. The apparatus of claim 1, wherein the audio input is one or more audio inputs and the audio output is one or more audio outputs.

4. The apparatus of claim 1, wherein the loading events of the signal path comprise a first current drawn from the battery by the signal path and the loading events of components other than the signal path comprise a second current drawn from the battery by the other components.

5. The apparatus of claim 1, wherein the adaptive battery model is used to generate a predicted power supply voltage.

6. The apparatus of claim 5, wherein the voltage component and the resistive component are utilized to calculate the maximum power threshold.

7. The apparatus of claim 6, wherein the adaptive battery model comprises: a Thevenin circuit having a voltage component and a resistor component, wherein a power supply voltage signal generated by the adaptive battery model, an amplifier input to an amplifier, an estimate of a power supply capacitance, and an estimate of a load impedance of the amplifier are used to identify the voltage component and the resistor component.

8. The apparatus of claim 7, wherein the adaptive battery model is configured to provide an estimate of power demanded by the amplifier, wherein the estimate of the power demanded by the amplifier is computed from an output of the amplifier and the load impedance of the amplifier to arrive at a product of voltage and current.

9. The apparatus of claim 8, wherein the estimate of the power demanded by the amplifier is used, along with the estimates of the voltage component, the resistor component, and the power supply capacitance, to predict the power supply voltage.

10. The apparatus of claim 5, wherein the information indicative of the anticipated effects of the power supply capacitance is used to apply a linear filter operating on the predicted power supply voltage.

11. The apparatus of claim 7, wherein a first envelope detector that detects a first envelope is applied to the power supply voltage signal and a second envelope detector that detects a second envelope is applied to the predicted power supply voltage for tracking local maximums.

12. The apparatus of claim 11, wherein a difference between the first and second envelopes is used to adjust an estimate of the voltage component.

13. The apparatus of claim 7, wherein a first envelope detector that detects a first envelope is applied to a negative of the power supply voltage signal and a second envelope detector that detects a second envelope is applied to a negative of the predicted power supply voltage for tracking local minimums.

14. The apparatus of claim 13, wherein a difference between the first and second envelopes is used to adjust an estimate of the resistor component.

15. The apparatus of claim 1, wherein the information indicative of at least one condition of a complex load impedance can be used to reduce the selectable attenuation signal in response to determining a high reactance in the complex load impedance.

16. The apparatus of claim 2, wherein the signal path further comprises a buffer configured to delay propagation of the audio input signal to the audio output for a duration sufficient to permit the predictive brownout prevention system to generate the selectable attenuation signal such that the signal path may receive and process the selectable attenuation signal in response to the portion of the audio input signal having the brownout condition before such portion of the audio input signal propagates to the audio output.

17. A method for providing an audio output signal to an audio transducer, comprising:
receiving information indicative of an amplitude of an audio input signal;
receiving information indicative of a condition of a power supply of a signal path having an audio input for receiving the audio input signal and an audio output for providing the audio output signal;
receiving information indicative of adaptive estimates of power supply conditions, wherein the information indicative of adaptive estimates of the power supply conditions comprises information regarding a voltage component and a resistive component received from an adaptive battery model of a battery for providing electrical energy to a power supply for generating the power supply voltage;
adapting the adaptive battery model based on a monitored battery voltage output by the battery and loading events of the signal path and excluding loading events of components other than the signal path which are powered from the battery; and
in response to determining that a portion of the audio input signal has reached a maximum power threshold, generate a selectable attenuation signal to reduce an amplitude of the audio output signal such that the signal path attenuates the audio input signal or a derivative thereof in order to prevent brownout prior to propagation to the audio output of the portion of the audio input signal.

18. The method of claim 17, further comprising, preventing brownout of the audio output signal by:
receiving information indicative of an amplitude of the audio input signal;
receiving information indicative of a condition of the power supply;
determining from the information indicative of an amplitude of the audio input signal and the information indicative of a condition of the power supply whether a brownout condition exists; and
in response to determining that a brownout condition exists, causing the attenuation of the portion of the audio input signal.

19. The method of claim 17, wherein the audio input signal is one or more audio inputs and the audio output signal is one or more audio outputs.

20. The method of claim 17, wherein the loading events of the signal path comprise a first current drawn from the battery by the signal path and the loading events of components other than the signal path comprise a second current drawn from the battery by the other components.

21. The method of claim 20, further comprising using the adaptive battery model to generate a predicted power supply voltage.

22. The method of claim 21, wherein the voltage component and resistive component are utilized to calculate the maximum power threshold.

23. The method of claim 22, wherein the adaptive battery model comprises a Thevenin circuit having a voltage component and a resistor component, wherein a power supply voltage signal generated by the adaptive battery model, an amplifier input to an amplifier, an estimate of a power supply capacitance, and an estimate of a load impedance of the amplifier are used to identify the voltage component and the resistor component.

24. The method of claim 23, further comprising:
computing, by the adaptive battery model, an estimate of power demanded by the amplifier from an output of the amplifier and the load impedance of the amplifiers to arrive at a product of voltage and current; and
providing, by the adaptive battery model, the estimate of the power demanded by the amplifier.

25. The method of claim 24, further comprising predicting the power supply voltage using the estimate of the power demanded by the amplifier, along with the estimates of the voltage component, the resistor component, and the power supply capacitance.

26. The method of claim 21, wherein the information indicative of the anticipated effects of the power supply capacitance may be used to apply a linear filter operating on the predicted power supply voltage.

27. The method of claim 23, further comprising:
applying a first envelope detector to the power supply voltage and a second envelope detector to the predicted power supply voltage;
outputting a first envelope from the first envelope detector for tracking local maximums in power supply voltage; and
outputting a second envelope from the second envelope detector for tracking the local maximums in the predicted power supply voltage.

28. The method of claim 27, wherein a difference between the first envelope and the second envelope is used to adjust an estimate of the voltage component.

29. The method of claim 23, further comprising:
applying a first envelope detector to a negative of the power supply voltage signal and a second envelope detector to a negative of the predicted power supply voltage;
outputting a first envelope from the first envelope detector for tracking valleys and local minimums in the negative of the power supply voltage; and
outputting a second envelope from the second envelope detector for tracking minimums in the predicted power supply voltage.

30. The method of claim 29, wherein a difference between the first envelope and the second envelope is used to adjust an estimate of the resistance component.

31. The method of claim 17, wherein the information indicative of at least one condition of a complex load impedance can be used to reduce the selectable attenuation signal in response to determining a high reactance in the complex impedance.

32. The method of claim 18, further comprising delaying propagation of the audio input signal to the audio output for a duration sufficient to permit attenuation of the audio input signal or the derivative thereof before the portion of the audio input signal having the brownout condition propagates to the audio output.

* * * * *